US009979381B1

(12) United States Patent
Rasouli et al.

(10) Patent No.: US 9,979,381 B1
(45) Date of Patent: May 22, 2018

(54) SEMI-DATA GATED FLOP WITH LOW CLOCK POWER/LOW INTERNAL POWER WITH MINIMAL AREA OVERHEAD

(71) Applicant: QUALCOMM Incorporated, San Diego, CA (US)

(72) Inventors: Seid Hadi Rasouli, San Diego, CA (US); Xiangdong Chen, San Diego, CA (US); Venugopal Boynapalli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/338,181

(22) Filed: Oct. 28, 2016

(51) Int. Cl.
*H03K 3/356* (2006.01)
*H03K 3/012* (2006.01)
*H03K 19/20* (2006.01)

(52) U.S. Cl.
CPC ....... *H03K 3/012* (2013.01); *H03K 3/356121* (2013.01); *H03K 19/20* (2013.01)

(58) Field of Classification Search
None
See application file for complete search history.

(56) References Cited

U.S. PATENT DOCUMENTS

| 6,204,695 B1 | 3/2001 | Alfke et al. |
| 6,472,909 B1 | 10/2002 | Young |
| 6,624,677 B1 | 9/2003 | Wissel |
| 7,265,599 B1 | 9/2007 | Pasqualini |
| 7,902,878 B2 | 3/2011 | Saint-Laurent et al. |
| 7,940,100 B2 | 5/2011 | Keskin et al. |
| 8,072,252 B2 | 12/2011 | Bailey |
| 8,957,718 B2 | 2/2015 | Maeno |
| 9,035,686 B1 | 5/2015 | Hsu et al. |
| 9,130,549 B2 | 9/2015 | Balasubramanian et al. |
| 9,270,270 B2 | 2/2016 | Cai et al. |
| 9,755,618 B1 | 9/2017 | Rasouli et al. |
| 2009/0108896 A1* | 4/2009 | Yasuda ............... H03K 3/0375 327/202 |
| 2009/0256609 A1 | 10/2009 | Naffziger |
| 2013/0314134 A1* | 11/2013 | Kulmala ............. H03K 5/1534 327/155 |
| 2015/0116019 A1 | 4/2015 | Hsu et al. |
| 2016/0043706 A1 | 2/2016 | Elkin et al. |
| 2016/0049937 A1* | 2/2016 | Tong .................. H03K 19/0016 327/199 |

FOREIGN PATENT DOCUMENTS

| DE | 102005060394 A1 | 6/2007 |
| EP | 1940027 A2 | 7/2008 |
| WO | WO-2014179944 A1 | 11/2014 |

OTHER PUBLICATIONS

International Search Report and Written Opinion—PCT/US2017/054769—ISA/EPO—dated Feb. 7, 2018.

* cited by examiner

*Primary Examiner* — Long Nguyen
(74) *Attorney, Agent, or Firm* — Loza & Loza, LLP/Qualcomm

(57) ABSTRACT

Methods and systems for clock gating are described herein. In certain aspects, a method for clock gating includes receiving an input signal of a flip-flop and an output signal of the flip-flop, and passing a clock signal to an input of a gate in the flip-flop if the input signal and the output signal have different logic values or both the input signal and the output signal have a logic value of zero. The method also includes gating the clock signal if both the input signal and the output signal have a logic value of one.

22 Claims, 11 Drawing Sheets

US 9,979,381 B1

SEMI-DATA GATED FLOP WITH LOW CLOCK POWER/LOW INTERNAL POWER WITH MINIMAL AREA OVERHEAD

BACKGROUND

Field

Aspects of the present disclosure relate generally to flip-flops, and more particularly, to low power flip-flops with low area overhead.

Background

Flip-flops are commonly used in sequential logic circuits. A flip-flop has an input, an output, and a clock input that receives a clock signal. In operation, the flip-flop latches a logic value (e.g., one or zero) at the input on an active edge of the clock signal, and outputs the latched value at the output.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

A first aspect relates to a clock-gating device. The clock-gating device includes a logic device configured to receive an input signal of a flip-flop and an output signal of the flip-flop, and to output an enable signal based on the input signal and the output signal, wherein the enable signal has a first logic value if the input signal and the output signal have different logic values or both the input signal and the output signal have a logic value of zero, and the enable signal has a second logic value if both the input signal and the output signal have a logic value of one. The clock-gating device also includes a gate device configured to receive the enable signal, to pass a clock signal to an input of a gate in the flip-flop if the enable signal has the first logic value, and to gate the clock signal if the enable signal has the second logic value.

A second aspect relates to a method for clock gating. The method includes receiving an input signal of a flip-flop and an output signal of the flip-flop, and passing a clock signal to an input of a gate in the flip-flop if the input signal and the output signal have different logic values or both the input signal and the output signal have a logic value of zero. The method also includes gating the clock signal if both the input signal and the output signal have a logic value of one.

A third aspect relates to a system. The system includes a flip-flop and a clock-gating device. The flip-flop includes a first NOR gate having a first input, a second input, and an output, and a second NOR gate having a first input, a second input coupled to the output of the first NOR gate, and an output coupled to the second input of the first NOR gate. The clock-gating device includes a logic device configured to receive an input signal of a flip-flop and an output signal of the flip-flop, and to output an enable signal based on the input signal and the output signal, wherein the enable signal has a first logic value if the input signal and the output signal have different logic values or both the input signal and the output signal have a logic value of zero, and the enable signal has a second logic value if both the input signal and the output signal have a logic value of one. The clock-gating device also includes a gate device configured to receive the enable signal, to pass a clock signal to the first input of the first NOR gate if the enable signal has the first logic value, and to gate the clock signal if the enable signal has the second logic value.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
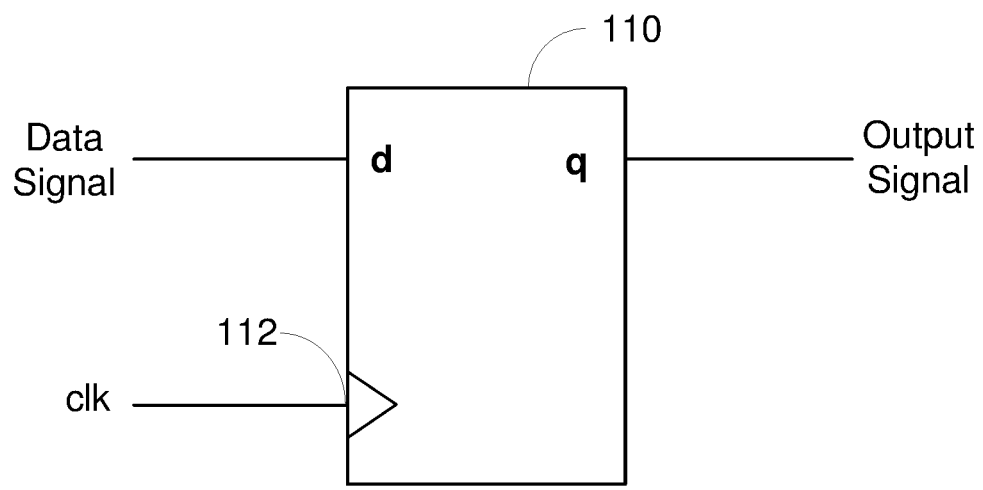
FIG. 1 shows an example of a flip-flop.

FIG. 1 shows a block diagram of an exemplary flip-flop 110. The flip-flop 110 has an input (labeled "d"), an output (labeled "q"), and a clock input 112. The flip-flop 110 is configured to receive an input signal (e.g., a data signal) at the input d, and a clock signal (labeled "clk") at the clock input 112. In operation, the flip-flop 110 latches a logic value (e.g., one or zero) at the input d on an active edge of the clock signal clk, and outputs the latched value at the output q until the next active edge of the clock signal clk. The flip-flop 110 may output the latched value to another circuit for further processing. For example, the flip-flop 110 may be part of a sequential logic circuit, and the flip-flop 110 may output the latched value to another circuit (e.g., buffer, another flip-flop, a logic gate, etc.) in the sequential logic circuit.

An active edge can be a rising edge or a falling edge depending on whether the flip-flop 110 is a positive-edge triggered flip-flop or a negative-edge triggered flip-flop. For example, if the flip-flop 110 is a positive-edge triggered flip-flop, then the flip-flop 110 latches the value of the input signal on a rising edge of the clock signal clk. If the flip-flop 110 is a negative-edge triggered flip-flop, then the flip-flop 110 latches the value of the input signal on a falling edge of the clock signal clk.

The flip-flop 110 consumes dynamic power when the clock signal clk switches logic states. This is because switching of the clock signal clk causes one or more transistors in the flip-flop 110 to switch. A problem with this is that, in many cases, the flip-flop 110 does not receive a new logic value that needs to be latched. In these cases, the clock signal clk causes switching activity in the flip-flop 110 even though the output q of the flip-flop 110 does not need to be updated. The unnecessary switching activity leads to an increase in power consumption.

Figure 2:
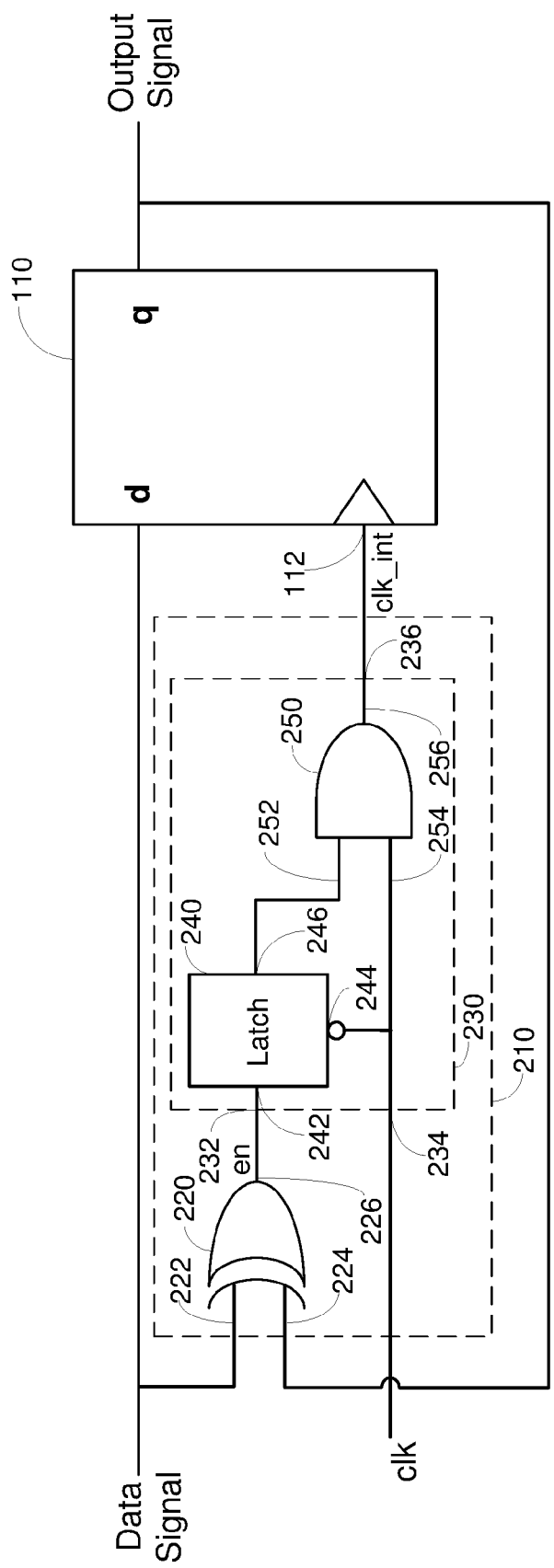
FIG. 2 shows an example of a clock-gating device according to certain aspects of the present disclosure.

To address this, a clock-gating device may be used to gate the clock signal clk when no new logic value needs to be latched by the flip-flop 110. In this regard, FIG. 2 shows an example of a clock-gating device 210. The clock-gating device 210 includes an XOR gate 220 and a clock-gating cell (CGC) 230. The XOR gate 220 has a first input 222 that receives the input signal, a second input 224 that receives the output of the flip-flop 110, and an output 226 that outputs an enable signal (labeled "en"). The clock-gating cell 230 has a first input 232 that receives the enable signal en, a second input 234 that receives the clock signal clk, and an output 236 that outputs an internal clock signal (labeled "clk_int") to the clock input 112 of the flip-flop 110.

The CGC 230 includes a negative-edge triggered latch 240 and an AND gate 250. The latch 240 has an input 242 that receives the enable signal en from the XOR gate 220, a clock input 244 that receives the clock signal clk, and an output 246. The AND gate 250 has a first input 252 that receives the output signal of the latch 240, a second input 254 that receives the clock signal clk, and an output 256 that outputs the internal clock signal clk_int.

In operation, the XOR gate 220 outputs a logic one (i.e., en=1) to the CGC 230 when the input and the output of the flip-flop 110 are different (i.e., d≠q). The latch 240 latches the logic one of the enable signal en on a falling edge of the clock signal clk, and outputs the latched logic one to the first input 252 of the AND gate 250. This causes the AND gate 250 to pass the clock signal clk to the clock input 112 of the flip-flop 110. Thus, when the input and the output of the flip-flop 110 are different, the clock signal clk is not gated.

The XOR gate 220 outputs a logic zero (i.e., en=0) to the CGC 230 when the input and the output of the flip-flop 110 are the same (i.e., d=q). The latch 240 latches the logic zero of the enable signal en on a falling edge of the clock signal clk, and outputs the latched logic zero to the first input 252 of the AND gate 250. This causes the AND gate 250 to output a logic zero to the clock input 112 of the flip-flop 110 regardless of the logic state of the clock signal clk, and therefore gate (block) the clock signal clk. Thus, when the input and the output of the flip-flop 110 are the same, the clock-gating device 210 gates the clock signal clk. This prevents unnecessary switching activity (toggling) in the flip-flop 110, thereby reducing power consumption.

The latch 240 prevents glitches in the internal clock signal clk_int input to the flip-flop 110. A glitch may occur, for example, if the AND gate 250 starts gating the clock signal clk when the clock signal clk is one (high). The latch 240 prevents this from occurring by latching the enable signal en on a falling edge of the clock signal clk. Thus, if the enable signal en changes (switches) from one to zero when the clock signal clk is one, the latch 240 does not latch the change in the enable signal en until the next falling edge of the clock signal clk. As a result, the AND 250 gate does not see the change in the enable signal en until the clock signal clk changes to zero, and therefore does not start gating the clock signal clk until the clock signal clk changes to zero.

The clock-gating device 210 shown in FIG. 2 adds significant power and area overhead due to the XOR gate 220 and the CGC 230. Accordingly, it is desirable to reduce the area and power overhead of the clock-gating device.

Figure 3:
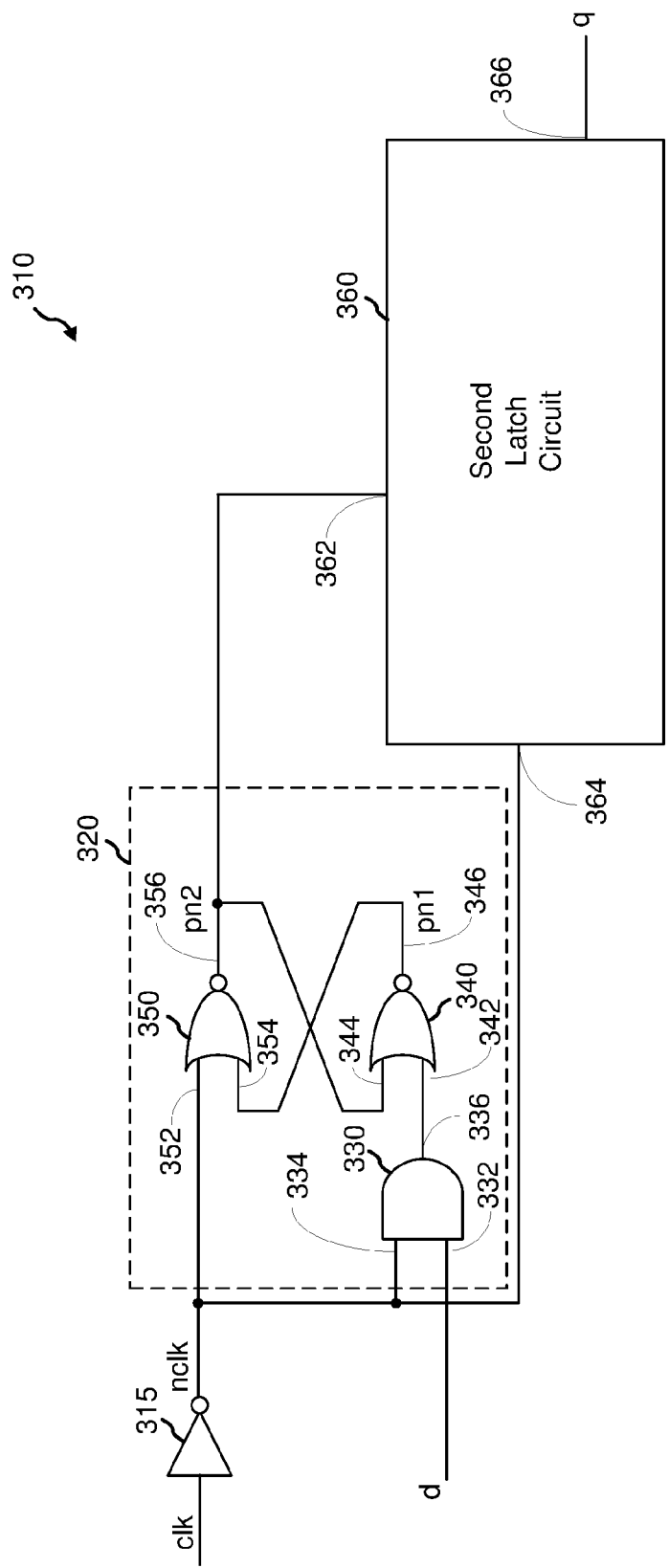
FIG. 3 is a logic diagram illustrating an example of a flip-flop according to certain aspects of the present disclosure.

FIG. 3 shows an example of a flip-flip 310 that is able to perform the functions of a conventional flip-flop with fewer clock transistors. As discussed further below, embodiments of the present disclosure exploit certain properties of the flip-flop 310 to provide a clock-gating device with reduced area and power overhead.

As shown in FIG. 3, the flip-flop 310 includes a first inverter 315, a first latch circuit 320, and a second latch circuit 360. The first inverter 315 is configured to receive an input clock signal clk, and to invert the clock signal clk into clock signal nclk.

The first latch circuit 320 includes a first AND gate 330, a first NOR gate 340, and a second NOR gate 350. The first AND gate 330 has a first input 332 that receives the input signal d of the flip-flop 310, a second input 334 that receives clock signal nclk from the first inverter 315, and an output 336. The first NOR gate 340 has a first input 342 coupled to the output 336 of the first AND gate 330, a second input 344, and an output 346. The second NOR gate 350 has a first input 352 that receives clock signal nclk from the first inverter 315, a second input 354 coupled to the output 346 of the first NOR gate 340, and an output 356 coupled to the second input 344 of the first NOR gate 340. The output 356 of the second NOR gate 350 provides the output signal of the first latch circuit 320, which is input to the second latch circuit 360, as discussed further below. In FIG. 3, the node at the output 346 of the first NOR gate 340 is labeled pn1, and the node at the output 356 of the second NOR gate 350 is labeled pn2.

The first AND gate 330 and the first NOR gate 340 form an AND-OR-Inverter (AOI) structure, in which the OR function and inventor function of the AOI structure are performed by the first NOR gate 340. Also, the first and second NOR gates 340 and 350 are cross-coupled in that the output 346 of the first NOR gate 340 is coupled to the second input 354 of the second NOR gate 350, and the output 356 of the second NOR gate 350 is coupled to the second input 344 of the first NOR gate 340.

Operation of the first latch circuit 320 will now be described according to certain aspects of the present disclosure.

When the input clock signal clk is zero (low), clock signal nclk is one (high). This causes the second NOR gate 350 to output a zero at node pn2 regardless of the logic value at the second input 354 of the second NOR gate 350. This also causes the first AND gate 330 to pass the input signal d to the first input 342 of the first NOR gate 340. Thus, when the input clock signal clk is zero (low), the first latch circuit 320 outputs a zero to the second latch circuit 360, and the input signal d is passed (propagates) to the first input 342 of the first NOR gate 340.

The zero at node pn2 is also input to the second input 344 of the first NOR gate 340, which causes the first NOR gate 340 to act as an inverter that inverts the logic value at the first input 342 of the first NOR gate 340. Since the first AND gate 330 passes the input signal d to the first input 342 of the first NOR gate 340, the first NOR gate 340 inverts the input signal d, and outputs the inverted input signal d at node pn1. Therefore, when the input clock signal clk is zero (i.e., clock signal nclk is one), node pn1 is the inverse of the input signal d.

When the input clock signal clk switches from zero to one, clock signal nclk switches from one to zero. This causes the AND gate 330 to output a zero to the first input 342 of the first NOR gate 340 regardless of the logic value of the input signal d, and therefore to block the input signal d from the first input 342 of the first NOR gate 340. The zero at the first input 342 of the first NOR gate 340 causes the first NOR gate 340 to act as an inverter for the output 356 of the second NOR gate 350 (which is coupled to the second input 344 of the first NOR gate 340).

In addition, the logic zero of clock signal nclk causes the second NOR gate 350 to act as an inverter for the output 346 of the first NOR gate 340 (which is coupled to the second input 354 of the second NOR gate 350). Thus, both the first and second NOR gates 340 and 350 act as inverters coupled in a loop. This causes the first and second NOR gates 340 and 350 to latch (capture) the logic value of the inverted input signal d at node pn1. The latched logic value of the inverted input signal d at node pn1 is inverted at node pn2. Thus, the logic value of the input signal d is latched at node pn2.

Therefore, when the input clock signal clk switches from zero to one (i.e., clock signal nclk switches from one to zero), the first latch circuit 320 latches (captures) the logic value of the input signal d, and outputs the latched logic value at the output of the first latch circuit 320 (i.e., node pn2). The first latch circuit 320 outputs the latched logic value while the input clock signal clk is one. In other words, the first latch circuit 320 latches (captures) the logic value of the input signal d on a rising edge of the input clock signal clk, and outputs the latched logic value to the second latch circuit 360 while the input clock signal clk is one.

When the input clock signal clk switches from one back to zero (i.e., clock signal nclk switches from zero back to one), the first latch circuit 320 outputs a zero (i.e., node pn2 is zero). If the latched logic value at node pn2 is one prior to the input clock signal clk switching from one to zero, then node pn2 is discharged from one to zero when the input clock signal clk switches from one to zero. In other words, node pn2 is discharged on the falling edge of the clock signal clk. If the latched logic value at node pn2 is zero prior to the input clock signal clk switching from one to zero, then node pn2 stays at zero when the input clock signal clk switches from one to zero.

The second latch circuit 360 has a first input 362 coupled to the output of the first latch circuit 320, a second input 364 the receives clock signal nclk from the first inverter 315, and an output 366 that provides the output signal q of the flip-flop 310. Operation of the second latch circuit 360 will now be described according to certain aspects of the present disclosure.

When the input clock signal clk is one (high) (i.e., clock signal nclk is zero (low)), the second latch circuit 360 receives the logic value of the input signal d latched by the first latch circuit 320. The second latch circuit 360 passes the logic value of the input signal d latched by the first latch circuit 320 to the output q of the flip-flop 310.

When the input clock signal clk switches from one to zero (i.e., clock signal nclk switches from zero to one), the second latch circuit 360 latches the logic value of the input signal d latched by the first latch circuit 320, and outputs the latched logic value while the input clock signal clk is zero.

Thus, the first latch circuit 320 latches the logic value of the input signal d on a rising edge of the input clock signal clk, and outputs the latched logic value to the second latch circuit 360 while the input clock signal clk is one. During this time, the second latch circuit 360 passes the latched logic value of the input signal d to the output q. When the input clock signal switches from one to zero (which corresponds to a falling edge of the input clock signal clk), the second latch circuit 360 latches the latched logic value from the first latch circuit 320, and continues to output the latched logic value while the input clock signal clk is zero. As a result, the logic value of the input signal d latched (captured) by the first latch circuit 320 is output at the output q of the flip-flop until the next rising edge of the clock signal clk.

When the input d and the output q of the flip-flop 310 are both zero (i.e., d=0 and q=0), node pn2 is zero, and stays zero when the input clock signal clk switches logic states. This is because node pn2 is zero when the input clock signal clk is zero (low), as discussed above. Since the logic state of node pn2 remains at zero in this case, there is no need to gate clock signal nclk to prevent node pn2 from switching logic states in this case.

When the input d and the output q of the flip-flop 310 are both one (i.e., d=1 and q=1), node pn2 switches (toggles) from one to zero on a falling edge of the input clock signal clk. This is because the latched logic value at node pn2 is one when the input clock signal clk is one (high), and node pn2 is zero when the input clock signal clk is zero (low). As a result, each time the clock signal clk switches from one to zero, node pn2 switches from one to zero, which involves discharging node pn2. The switching of node pn2 causes unnecessary dynamic power consumption since the output q does not need to be updated in this case.

To address this, embodiments of the present disclosure provide a clock-gating device that gates (i.e., disables) clock signal nclk to the first NOR gate 350 when the input d and the output q of the flip-flop 310 are both one (i.e., d=1 and q=1). This prevents unnecessary switching of node pn2 when the input d and the output q are both one, thereby reducing power consumption.

The clock-gating device does not gate clock signal nclk when the input d and the output q of the flip-flop 310 are different or are both zero (i.e., d=0 and q=0). This is because node pn2 stays at zero when d=0 and q=0. Thus, clock gating is not required to prevent node pn2 from switching logic states for the case where d=0 and q=0. This allows the clock-gating device to be implemented with fewer transistors, as discussed further below.

Figure 4:
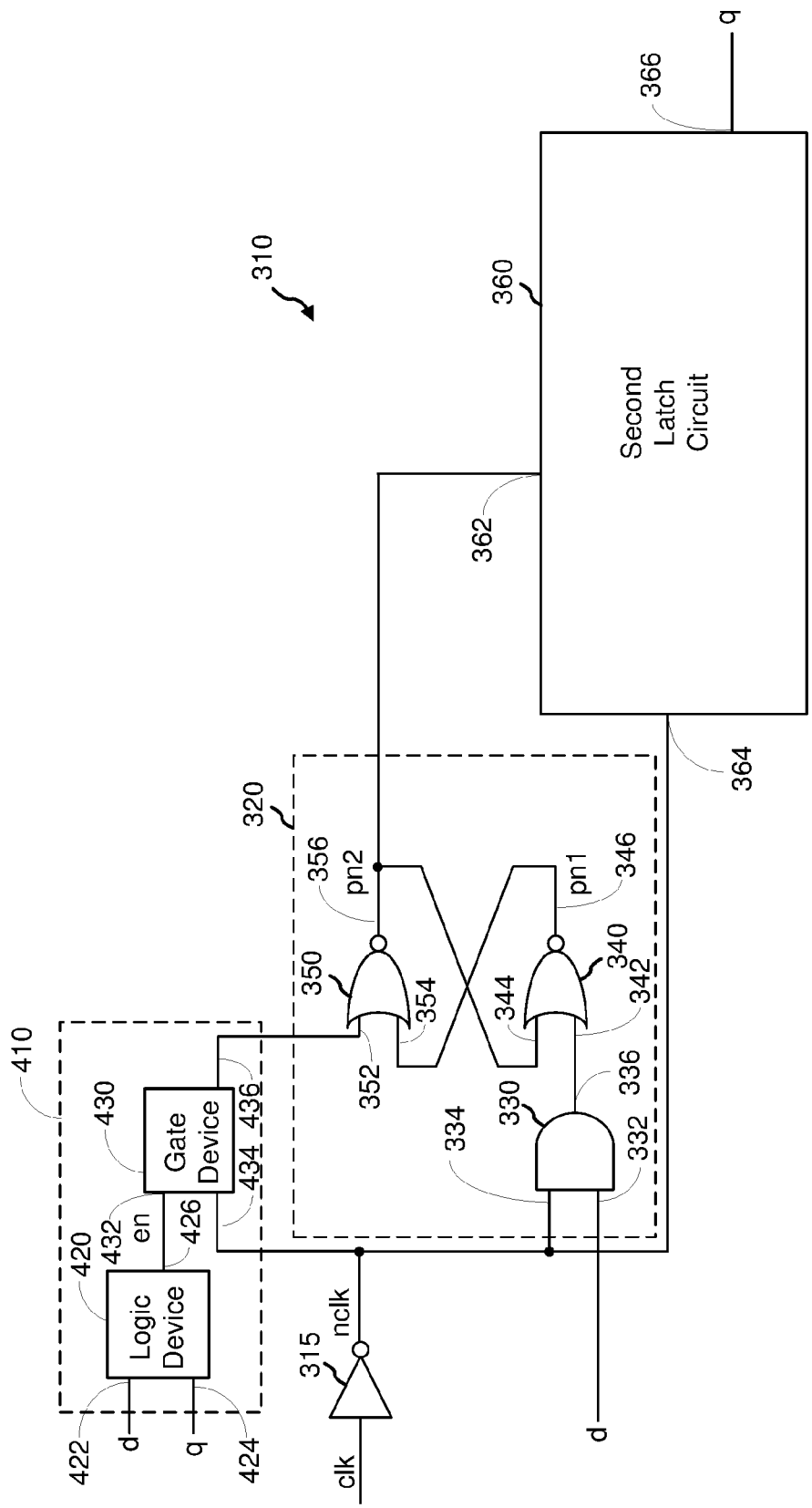
FIG. 4 shows an example of a clock-gating device with reduced area and power overhead according to certain aspects of the present disclosure.

FIG. 4 shows an exemplary implementation of the clock-gating device 410 according to certain aspects of the present disclosure. In this example, the clock-gating device 410 includes a logic device 420 and a gate device 430. The logic device 420 has a first input 422 that receives the input signal d of the flip-flop 310, a second input 424 that receives the output signal q of the flip-flop 310, and an output 426 that outputs an enable signal (labeled "en"). The gate device 430 has a first input 432 that receives the enable signal en, a second input 434 that receives the clock signal nclk from the first inverter 315, and an output 436 coupled to the first input 352 of the second NOR gate 350. As discussed further below, the gate device 430 is configured to selectively gate clock signal nclk under the control of the logic device 420.

The logic device 420 is configured to output an enable signal en of one to the gate device 430 when the input d and the output q of the flip-flop 310 are different (i.e., d q) or are both zero (i.e., d=0 and q=0). The gate device 430 is configured to pass clock signal nclk to the first input 352 of the second NOR gate 350 when the enable signal en is one. Thus, clock signal nclk in not gated when the input d and the output q of the flip-flop 310 are different or are both zero.

The logic device 420 is configured to output an enable signal en of zero to the gate device 430 when the input d and output q of the flip-flop 310 are both one (i.e., d=1 and q=1). The gate device 430 is configured to gate (block) clock signal nclk to the first input 352 of the second NOR gate 350 when the enable signal en is zero. Thus, when the input d and output q of the flip-flop 310 are both one, clock signal nclk is gated. In this case, the gate device 430 outputs a zero to the first input 352 of the second NOR gate 350, which prevents switching of node pn2 in this case, as discussed above.

In this example, the clock-gating device 410 selectively gates clock signal nclk, which is the inverse of the input clock signal clk. This helps prevent glitches from occurring without the need for the latch 240 shown in FIG. 2. As discussed above, the latch 240 is used in the clock-gating device 210 in FIG. 2 to prevent a glitch caused by initiating gating of the clock signal clk when the clock signal clk is one (high). Since clock signal nclk is the inverse of the input clock signal clk, clock signal nclk is zero (low) when the input clock signal clk is one (high). Thus, gating clock signal nclk avoids the glitch discussed above. By not including the latch 240 in the clock-gating device 410, the area and power overhead of the clock-gating device 410 can be significantly reduced compared with the clock-gating device 210 in FIG. 2.

Also, in this example, clock signal nclk to the second input 334 of the first AND gate 330 is not gated by the clock-gating device 410. This is because the clock-gating device 410 is not on the clock path between the inverter 315 and the first AND gate 330. Also, clock signal nclk to the second latch circuit 360 is not gated by the clock-gating device 410 in this example. This is because the clock-gating device 410 is not on the clock path between the inverter 315 and the second latch circuit 360.

Figure 5:
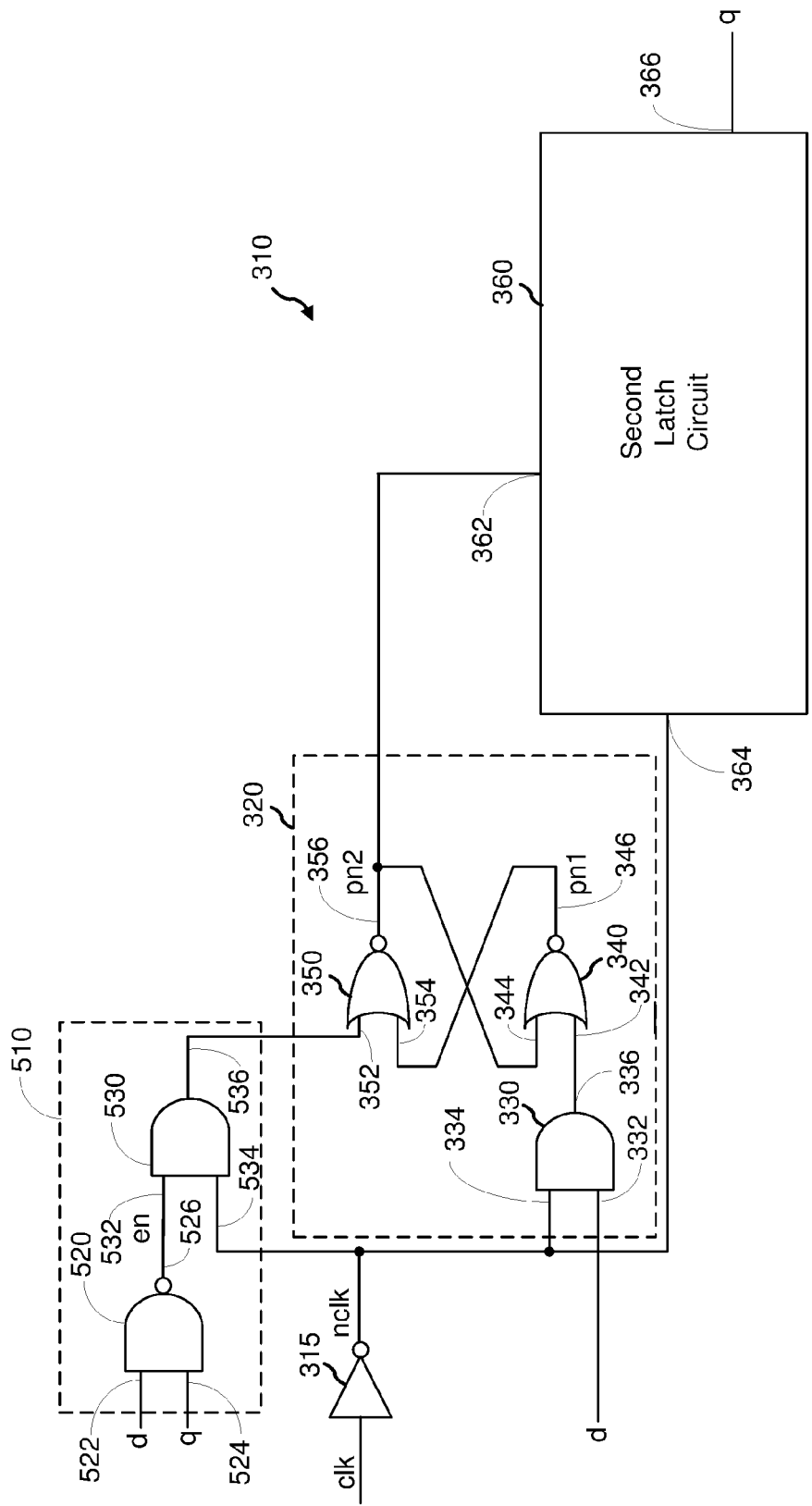
FIG. 5 shows an exemplary implementation of the clock-gating device according to certain aspects of the present disclosure.

The clock-gating device 410 may be implemented using a variety of different logic circuits. In this regard, FIG. 5 shows an exemplary implementation of the clock-gating device 510 in which the logic device 420 in FIG. 4 is implemented with a NAND gate 520, and the gate device 430 in FIG. 4 is implemented with an AND gate 530.

The NAND gate 520 has a first input 522 that receives the input signal d, a second input 524 that receives the output q of the flip-flop 310, and an output 526 that outputs the enable signal (labeled "en"). The AND gate 530 has a first input 532 that receives the enable signal en, a second input 534 that receives clock signal nclk, and an output 536 coupled to the first input 352 of the second NOR gate 350.

The NAND gate 520 outputs a logic one (i.e., en=1) to the AND gate 530 when the input d and the output q of the flip-flop 310 are different (i.e., d q) or are both zero (i.e., d=0 and q=0). This causes the AND gate 530 to pass clock signal nclk to the second NOR gate 350. Thus, clock signal nclk is un-gated when the input q and the output d of the flip-flop 310 are different or are both zero.

The NAND gate 520 outputs a logic zero (i.e., en=0) to the AND gate 530 when the input d and output q of the flip-flop 310 are both one (i.e., d=1 and q=1). This causes the AND gate 530 to output a zero regardless of the logic state of clock signal nclk, and therefore to gate (block) the clock signal nclk to the second NOR gate 350. Thus, when the input d and output q of the flip-flop 310 are both one, clock signal nclk is gated, which prevents unnecessary switching of node pn2 for the case where d=1 and q=1.

A NAND gate can be implemented with fewer transistors than an XOR gate. Thus, the NAND gate 520 reduces the area and power overhead of the clock-gating device 510 compared with the clock-gating device 210, which uses the XOR gate 220 in FIG. 2 to generate the enable signal en.

Figure 6A:
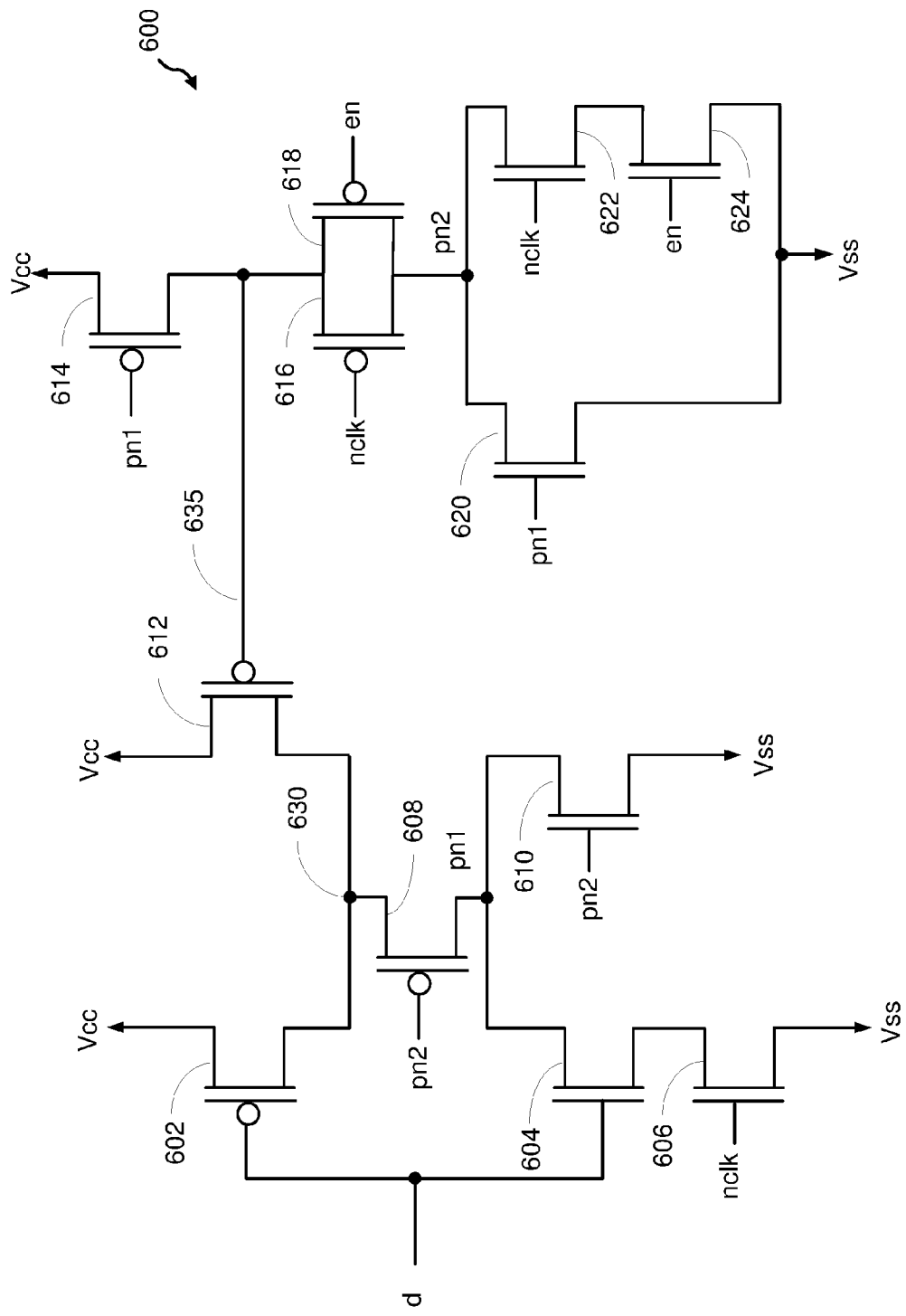
FIG. 6A shows an exemplary implementation of a latch circuit and a gate device at the transistor level according to certain aspects of the present disclosure.

FIG. 6A shows an exemplary implementation 600 of the first latch circuit 320 and the gate device 430 (e.g., AND gate 530) at the transistor level according to certain aspects of the present disclosure. It is to be appreciated that some of the transistors shown in FIG. 6A are shared by two or more of the logic gates shown in FIG. 4 (e.g., AND gate 330, first NOR gate 340 and second NOR gate 350), as discussed further below. This reduces the number of transistors needed to implement the first latch circuit 320 compared with implementing each of the logic gates individually using separate transistors.

In this example, the exemplary implementation 600 includes p-type metal oxide semiconductor (PMOS) transistors 602, 608, 612, 614, 616 and 618, and n-type metal oxide semiconductor (NMOS) transistors 604, 606, 610, 620, 622 and 624. PMOS transistor 602 is coupled between the upper supply rail Vcc and node 630. The gate of PMOS transistor 602 receives the input signal d. PMOS transistor 608 is coupled between node 630 and node pn1. The gate of PMOS transistor 608 is coupled to node pn2. NMOS transistors 604 and 606 are coupled in series between node pn1 and the lower supply rail Vss. The lower supply rail Vss may be coupled to ground. The gate of NMOS transistor 604 receives the input signal d, and the gate of NMOS transistor 606 receives clock signal nclk, which is the inverse of the input clock signal clk, as discussed above. NMOS transistor 610 is coupled between node pn1 and the lower supply rail Vss. The gate of NMOS transistor 610 is coupled to node pn2.

PMOS transistor 612 is coupled between the upper supply rail Vcc and node 630. The gate of PMOS transistor 612 is coupled to node 635. PMOS transistor 614 is coupled between the upper supply rail Vcc and node 635. The gate of PMOS transistor 614 is coupled to node pn1. PMOS transistors 616 and 618 are coupled in parallel between node 635 and node pn2. The gate of PMOS transistor 616 receives clock signal nclk, and the gate of PMOS transistor 618 receives the enable signal en from the logic device 420 (e.g., NAND gate 520).

NMOS transistor 620 is coupled between node pn2 and the lower supply rail Vss. The gate of NMOS transistor 620 is coupled to node pn1. NMOS transistors 622 and 624 are coupled in series between node pn2 and the lower supply rail Vss. The gate of NMOS transistor 622 receives clock signal nclk, and the gate of NMOS transistor 624 receives the enable signal en.

Operation of the exemplary implementation 600 of the first latch circuit 320 and gate device 430 will now be described according to certain aspects.

Figure 6B:
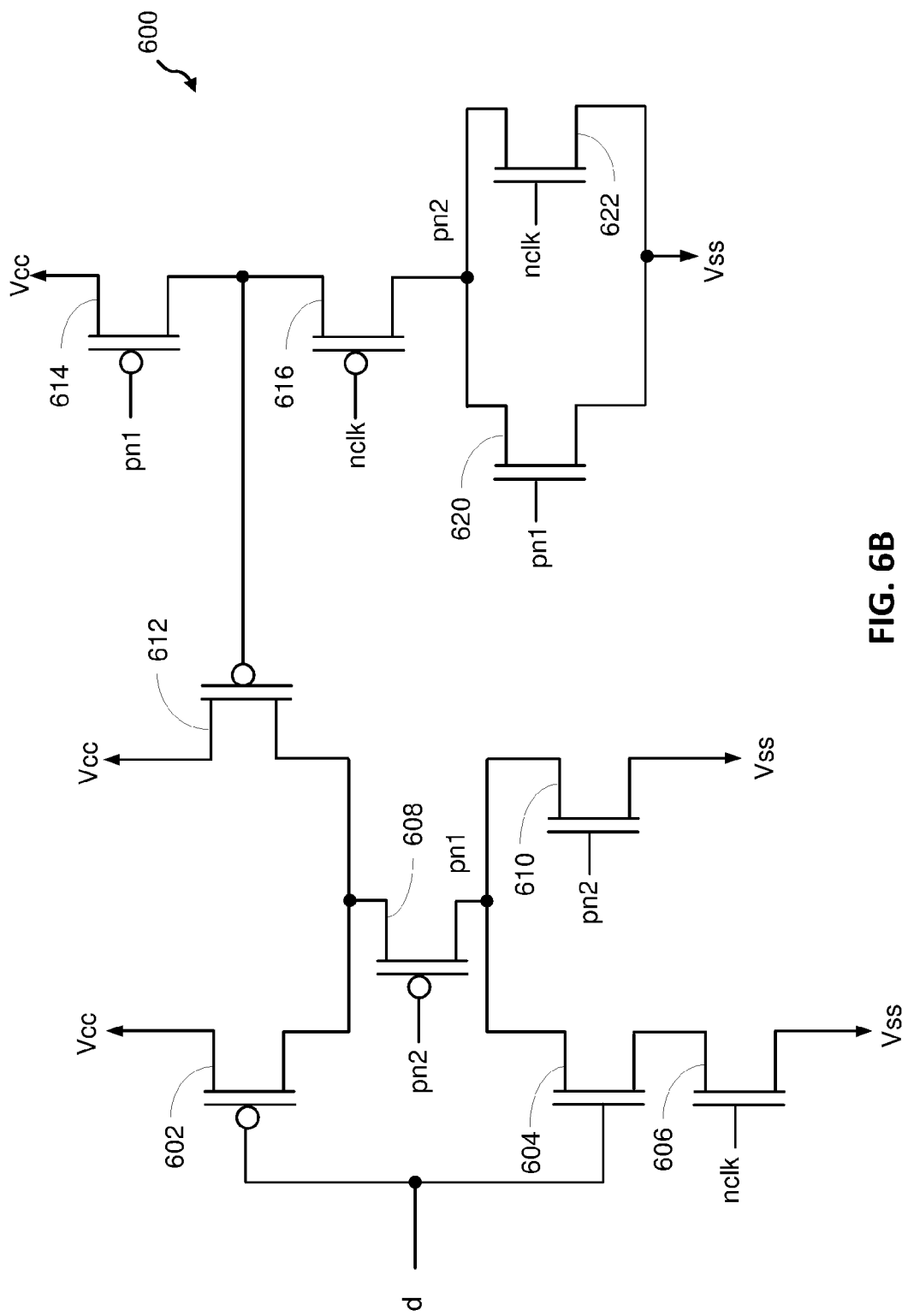
FIG. 6B shows a circuit equivalent of FIG. 6A for the case in which a clock signal is not gated according to certain aspects of the present disclosure.

Operation will first be described for the case in which the enable signal en is one (i.e., clock signal nclk is not gated). In this case, NMOS transistor 624 is turned on, and therefore couples the source of NMOS transistor 622 to Vss. Also, PMOS transistor 618 is turned off. In this regard, FIG. 6B shows the circuit equivalent of FIG. 6A for the case in which the enable signal en is one. For ease of discussion, operation for this case is described below with reference to FIG. 6B.

When the input clock clk is zero (low), clock signal nclk is one (high). This causes NMOS transistor 622 to turn on, and pull node pn2 to zero. Also, PMOS transistor 616 is turned off, thereby decoupling node pn2 from the drain of PMOS transistor 614. Thus, node pn2 is zero when clock signal nclk is one. Therefore, NMOS transistor 622 performs the function of the second NOR gate 350 when clock signal nclk is one.

In addition, NMOS transistor 606 is turned on since clock signal nclk is one. As a result, the source of NMOS transistor 604 is coupled to Vss. Further, PMOS transistor 608 is turned on since node pn2 is zero. This causes PMOS transistor 608 to couple the drains of PMOS transistor 602 and NMOS transistor 604 together to node pn1. As a result, PMOS transistor 604 and NMOS transistor 606 form an inverter between Vcc and Vss having an input coupled to the input signal d and an output coupled to node pn1. The inverter inverts the input signal d and outputs the inverted input signal at node pn1. Thus, these transistors perform the functions of the AND gate 330 and first NOR gate 340 when clock signal nclk is one.

When the input clock clk is one (high), clock signal nclk is zero (low). This causes NMOS transistor 622 to turn off and PMOS transistor 616 to turn on. As a result, the drain of PMOS transistor 614 is coupled to the drain of NMOS transistor 620 via PMOS transistor 616. This causes the PMOS transistor 614 and NMOS transistor 620 to form an inverter between Vcc and Vss having an input coupled to node pn1 and an output coupled to node pn2. Thus, these transistors perform the function of the second NOR gate 350 when clock signal nclk is zero (low).

In addition, PMOS transistors 608 and 612 and NMOS transistor 610 form an inverter having an input coupled to node pn2 and an output coupled to node pn1 regardless of the logic value of the input signal d, as discussed further below. Thus, these transistors perform the function of the first NOR gate 340 when clock signal nclk is zero.

When the input signal d is zero, PMOS transistor 602 is turned on and couples the source of PMOS transistor 608 to Vcc. In this case, PMOS transistor 608 and NMOS transistor 610 form an inverter between Vcc and Vss having an input coupled to node pn2 and an output coupled to node pn1.

When the input signal d is one, PMOS transistor 602 is turned off. In this case, PMOS transistors 608 and 612 and NMOS transistor 610 form an inverter between Vcc and Vss having an input coupled to node pn2 and an output coupled to node pn1. The inverter includes two stacked PMOS transistors (i.e., PMOS transistors 608 and 612), in which the gate of each PMOS transistor is coupled to node pn2. Note that the gate of PMOS transistor 612 is coupled to node pn2 via PMOS transistor 616, which is turned on. Thus, PMOS transistors 608 and 612 and NMOS transistor 610 form an inverter independent of the logic value of the input signal d.

Figure 6C:
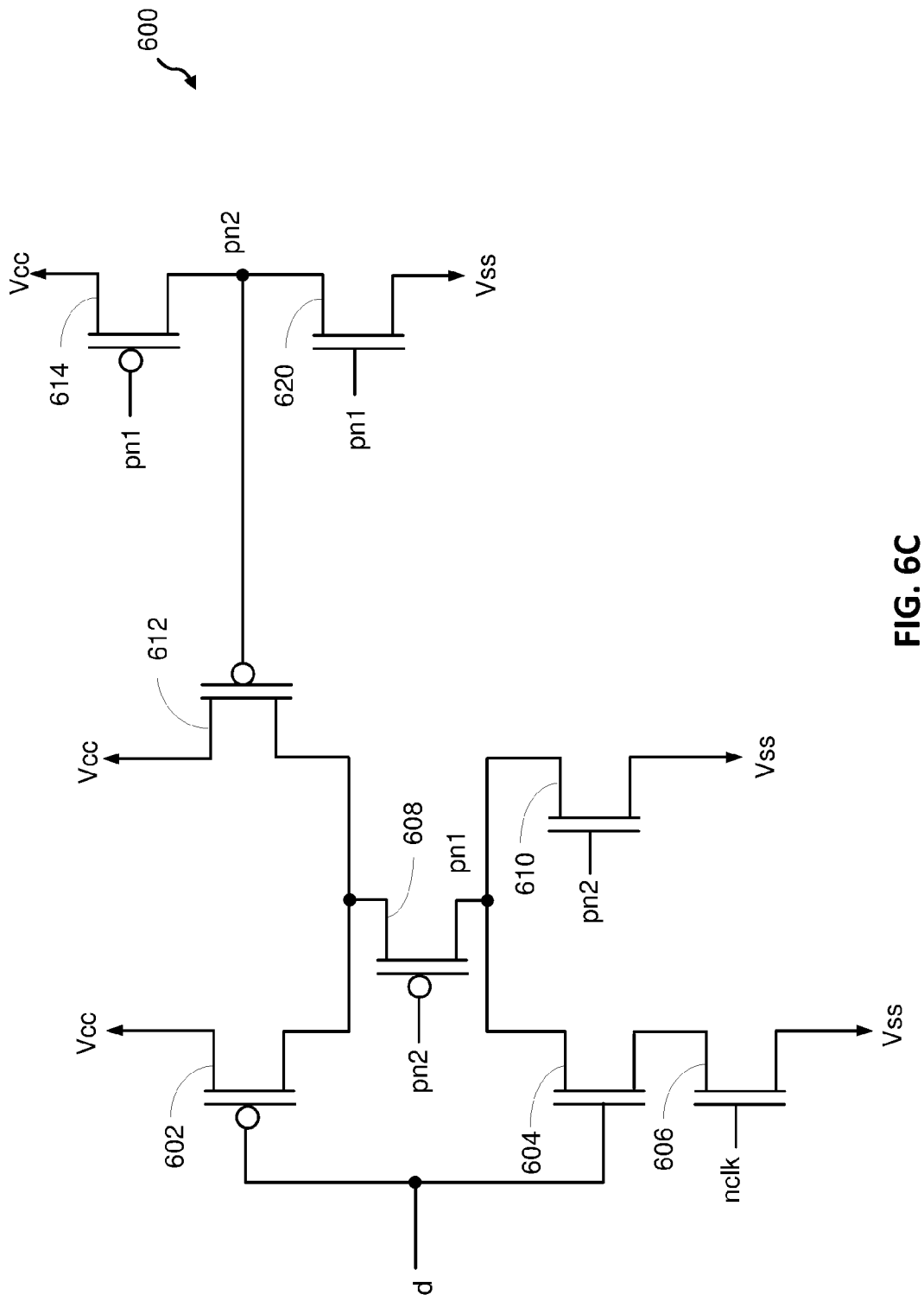
FIG. 6C shows a circuit equivalent of FIG. 6A for the case in which the clock signal is gated according to certain aspects of the present disclosure.

Operation will now be described for the case in which the enable signal en is zero (i.e., clock signal nclk is gated). In this case, NMOS transistor 624 is turned off, and therefore decouples the source of NMOS transistor 622 from Vss. Also, PMOS transistor 618 is turned on, and therefore couples the drain of PMOS transistor 614 to node pn2. In this regard, FIG. 6C shows the circuit equivalent of FIG. 6A for the case in which the enable signal en is zero. For ease of discussion, operation for this case is described below with reference to FIG. 6C.

As discussed above, clock signal nclk is gated when the input d and the output q are both one. In this case, node pn2 is one. As shown in FIG. 6C, node pn2 is no longer pulled to zero by NMOS transistor 622 (shown in FIG. 6A) when clock signal nclk is one (i.e., input clock signal clk is zero). Thus, switching of the node pn2 from one to zero on the falling edges of the input clock signal clk is prevented, thereby reducing power consumption.

It is to be appreciated that the present disclosure is not limited to the exemplary implementation shown in FIG. 6A, and that the first latch circuit 320 and the gate device 430 may be implemented using other configurations of transistors.

Figure 7:
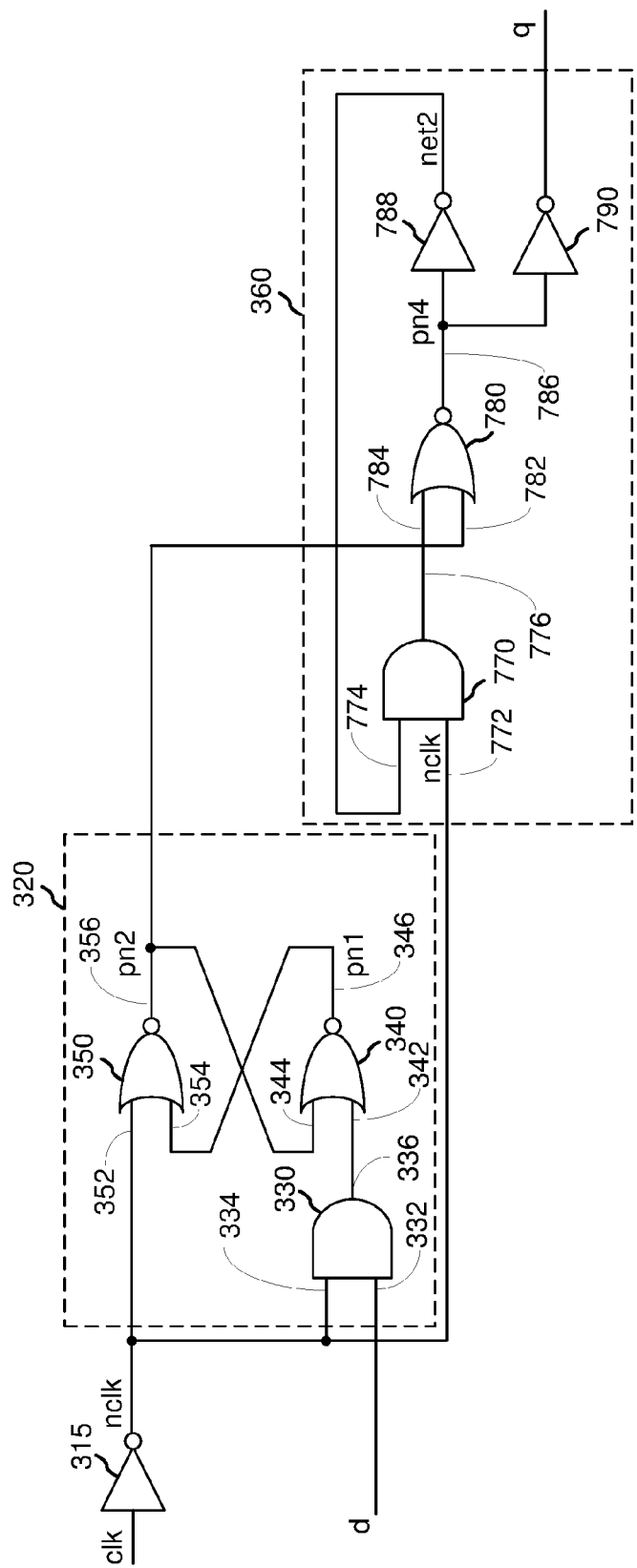
FIG. 7 is a logic diagram illustrating another example of a flip-flop according to certain aspects of the present disclosure.

FIG. 7 shows an exemplary implementation of the second latch circuit 360 at the logic gate level according to certain aspects. In this example, the second latch circuit 360 includes a second AND gate 770, a third NOR gate 780, a second inverter 788 and a third inverter 790. The second AND gate 770 has a first input 772 that receive clock signal nclk from the first inverter 315, a second input coupled to node net2, and an output 776. The third NOR gate 780 has a first input 782 coupled to the output of the first latch circuit (i.e., node pn2), a second input 784 coupled to the output 776 of the second AND gate 770, and an output 786. The node at the output 786 of the third NOR gate 780 is labeled node pn4 in FIG. 7. The second inverter 788 has an input coupled to the output 786 of the third NOR gate 780 (i.e., node pn4) and an output coupled to the second input 774 of the AND gate 770 at node net2. The third inverter 790 has an input coupled to the output 786 of the third NOR gate 780 (i.e., node pn4) and an output that provides the output q of the flip-flop 310.

Operation of the exemplary implementation of the second latch circuit 360 shown in FIG. 7 will now be described according to certain aspects of the present disclosure.

When the input clock signal clk is one (high) (i.e., clock signal nclk is zero (low)), the second AND gate 770 output a zero to the second input 784 of the third NOR gate 780. This causes the third NOR gate 780 to act as an inverter that inverts the output of the first latch circuit 320. Thus, the NOR gate 780 inverts the logic value latched by the first latch circuit 320, and outputs the inverted latched logic value at node pn4. The third inverter 790 inverts the inverted latched logic value at node pn4, and therefore outputs the latched logic value at the output q. Thus, the third NOR 780 and the third inverter 790 pass the logic value latched by the first latch circuit 320 to the output q.

When the input clock signal clk switches from one to zero (i.e., clock signal nclk switches from zero to one), node pn2 is zero, as discussed above. This causes the third NOR gate 780 to act as an inverter that inverts the logic value at the second input 784 of the third NOR gate 780. In addition, the second AND gate 770 couples the output of the second inverter 788 to the second input 784 of the third NOR gate 780. Thus, the third NOR gate 780 acts as an inverter that is coupled to the second inverter 788 in a loop. As a result, the third NOR gate 780 and the second inverter 788 latch the logic value at node pn4 (which is the inverse of the logic value latched by the first latch circuit 320). The third inverter 790 inverts the inverted latched logic value at node pn4, and therefore outputs the latched logic value at the output q.

Figure 8:
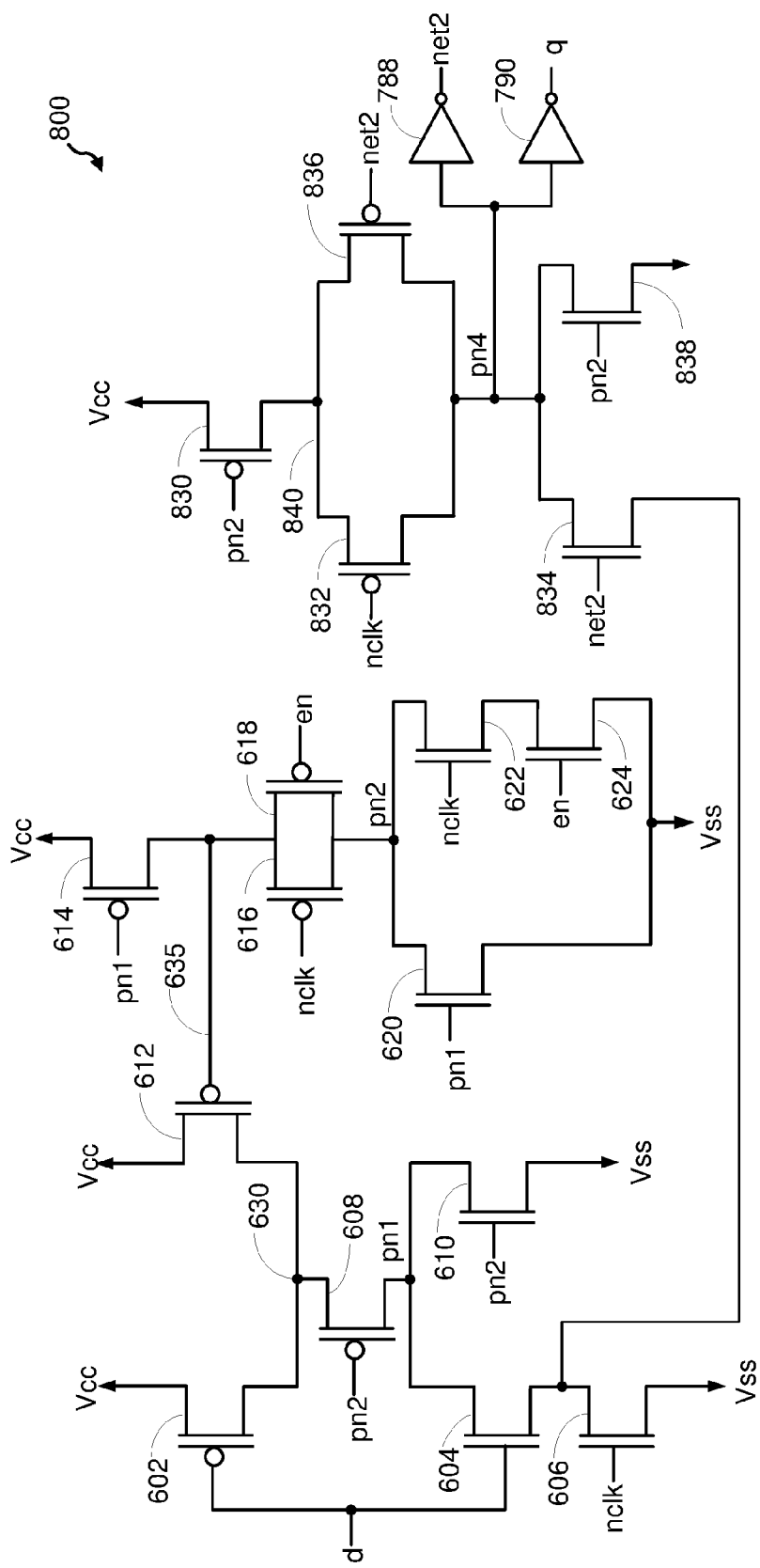
FIG. 8 shows an exemplary implementation of a flip-flop and a gate device at the transistor level according to certain aspects of the present disclosure.

FIG. 8 shows an exemplary implementation 800 of the second latch circuit 360 at the transistor level according to certain aspects of the present disclosure. FIG. 8 also shows the exemplary implementation of the first latch circuit 320 and the gate device 430 shown in FIG. 6A.

In this example, the second latch circuit 360 includes PMOS transistors 830, 832 and 836, and NMOS transistors 834 and 838. PMOS transistor 830 is coupled between the upper supply rail Vcc and node 840. The gate of PMOS transistor 830 is coupled to node pn2 at the output of the first latch circuit 320. PMOS transistors 832 and 836 are coupled in parallel between node 840 and node pn4. The gate of PMOS transistor 832 receives clock signal nclk, and the gate of PMOS transistor 836 is coupled to node net2 at the output of the second inverter 788. NMOS transistor 838 is coupled between node pn4 and the lower supply rail Vss. The gate of NMOS transistor 838 is coupled to node pn2. NMOS transistor 834 is coupled between node pn4 and the drain of NMOS transistor 606. The gate of NMOS transistor 834 is coupled to node net2 at the output of the second inverter 788.

Operation of the exemplary implementation of the second latch circuit 360 shown in FIG. 8 will now be described according to certain aspects of the present disclosure.

When the input clock signal clk is one (high) (i.e., clock signal nclk is zero (low)), PMOS transistor 832 is turned on, and couples the drain of PMOS transistor 830 to the drain of NMOS transistor 838. As a result, PMOS transistor 830 and NMOS transistor 838 form an inverter between Vcc and Vss having an input coupled to node pn2 and an output coupled to node pn4. Thus, PMOS transistor 830 and NMOS transistor 838 perform the function of the third NOR gate 780 when the input clock signal clk is one. In this case, the second latch circuit 360 passes the latched logic value at the output of the first latch circuit 320 (i.e., node pn2) to the output q of the flip-flop 310.

When the input clock signal clk switches from one to zero (i.e., clock signal nclk switches from zero to one), node pn2 is zero, as discussed above. This causes PMOS transistor 830 to turn on (and therefore couple node 840 to the upper supply rail Vcc) and NMOS transistor 838 to turn off. In addition, PMOS transistor 832 is turned off since clock signal nclk is one. Further, NMOS transistor 606 is turned on, and therefore couples the source of NMOS transistor 834 to the lower supply rail Vss. As a result, PMOS transistor 836 and NMOS transistor 834 form an inverter between Vcc and Vss having an input coupled to node net2 (i.e., output of the second inverter 788) and an output coupled to node pn4 (i.e., input of the second inverter 788). Thus, this inverter is coupled to the second inverter 788 in a loop, which latches the logic value at node pn4 (which is the inverse of the logic value latched by the first latch circuit 320). The third inverter 790 inverts the inverted latched logic value at node pn4, and therefore outputs the latched logic value at the output q.

It is to be appreciated that the present disclosure is not limited to the exemplary implementation shown in FIG. 8, and that the second latch circuit 360 may be implemented using other configurations of transistors.

In the above examples, the logic device 420 outputs an enable signal en of one to un-gate clock signal nck and outputs an enable signal of zero to gate clock signal nclk. However, it is to be appreciated that the present disclosure is not limited to this example. In general, the logic device 420 outputs an enable signal en having a first logic value to un-gate clock signal nck (when d and q are different or are both zero), and outputs an enable signal en having a second logic value to gate clock signal nck (when d=1 and q=1). The gate device 430 un-gates clock signal nclk when the enable signal en has the first logic value, and gates clock signal nclk when the enable signal en has the second logic value.

Figure 9:
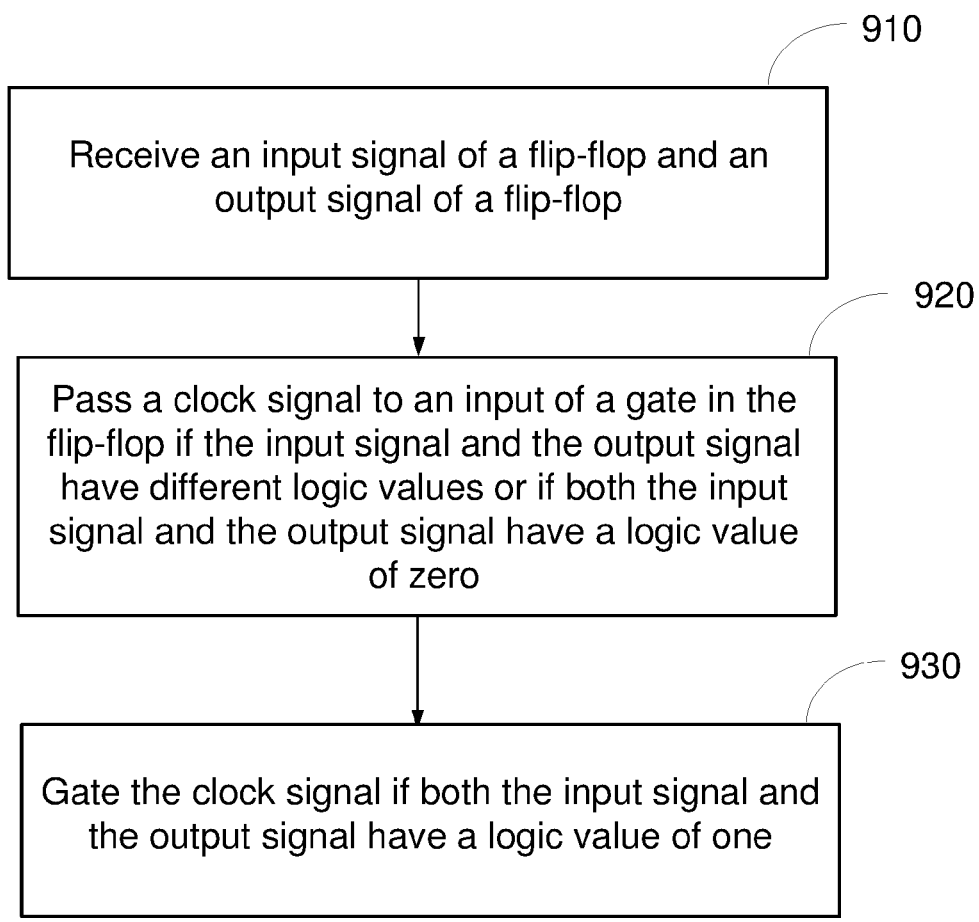
FIG. 9 is a flowchart illustrating a method for clock gating according to certain aspects of the present disclosure.

FIG. 9 is a flowchart illustrating a method 900 for clock gating according to certain aspects of the present disclosure. The method 900 may be performed by the clock-gating device 410.

At step 910, an input signal of a flip-flop and an output signal of the flip-flop are received. For example, the input signal may correspond to input signal d of the flip-flop 310, and the output signal may correspond to output signal q of the flip-flop 310.

At step 920, a clock signal is passed to an input of a gate in the flip-flop if the input signal and the output signal have different logic values or both the input signal and the output signal have a logic value of zero. The clock signal may correspond to clock signal nclk, and the gate may correspond to NOR gate 350.

At step 930, the clock signal is gated if both the input signal and the output signal have a logic value of one. Gating the clock signal may include outputting a logic zero to the input (e.g., input 352) of the gate (e.g., NOR gate 350) independent (regardless) of the logic state of the clock signal (e.g., clock signal nclk).

It is to be appreciated that the input signal of the flip-flop may correspond to a signal having the same logic value as input d. Also, the output signal of the flip-flop may correspond to a signal having the same logic value as output q. For example, one or more buffers may be coupled to output q shown in FIG. 3. In this example, the output signal may be a signal at the output of one of the buffers, in which the output signal has the same logic value as output q with a short delay (delay of one or more of the buffers). Also, it is to be appreciated that the logic device 420 (e.g., NAND gate 520) does not have to be directly connected to input d and output q shown in FIG. 3 (e.g., may be coupled to input d and output q via one or more buffers).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A clock-gating device, comprising:
   a logic device configured to receive an input signal of a flip-flop and an output signal of the flip-flop, and to output an enable signal based on the input signal and the output signal, wherein the enable signal has a first logic value if the input signal and the output signal have different logic values, the enable signal has the first logic value if both the input signal and the output signal have a logic value of zero, and the enable signal has a second logic value if both the input signal and the output signal have a logic value of one; and
   a gate device configured to receive the enable signal, to pass a clock signal to an input of a gate in the flip-flop if the enable signal has the first logic value, and to gate the clock signal if the enable signal has the second logic value.

2. The clock-gating device of claim 1, wherein the first logic value is a logic one and the second logic value is a logic zero.

3. The clock-gating device of claim 1, wherein the logic device comprises a NAND gate having a first input configured to receive the input signal of the flip-flop, a second input configured to receive the output signal of the flip-flop, and an output that outputs the enable signal.

4. The clock-gating device of claim 3, wherein the gate device comprises an AND gate having a first input coupled to the output of the NAND gate, a second input configured to receive the clock signal, and an output coupled to the input of the gate in the flip-flop.

5. The clock-gating device of claim 1, wherein the gate in the flip-flop comprises a first NOR gate.

6. The clock-gating device of claim 5, wherein the clock signal is an inverse of an input clock signal input to the flip-flop.

7. The clock-gating device of claim 6, wherein the flip-flop is configured to latch a logic value of the input signal on a rising edge of the input clock signal.

8. The clock-gating device of claim 5, wherein the gate device outputs a logic zero to the input of the first NOR gate when the clock signal is gated independent of a logic state of the clock signal.

9. The clock-gating device of claim 5, wherein the flip-flop comprises a second NOR gate cross-coupled with the first NOR gate.

10. A method for clock gating, comprising:
receiving an input signal of a flip-flop and an output signal of the flip-flop;
passing a clock signal to an input of a gate in the flip-flop if the input signal and the output signal have different logic values;
passing the clock signal to the input of the gate in the flip-flop if both the input signal and the output signal have a logic value of zero; and
gating the clock signal if both the input signal and the output signal have a logic value of one.

11. The method of claim 10, wherein the gate in the flip-flop comprises a first NOR gate.

12. The method of claim 11, wherein the clock signal is an inverse of an input clock signal input to the flip-flop.

13. The method of claim 12, wherein the flip-flop is configured to latch a logic value of the input signal on a rising edge of the input clock signal.

14. The method of claim 11, wherein gating the clock signal comprises outputting a logic zero to the input of the first NOR gate when the clock signal is gated independent of a logic state of the clock signal.

15. The method of claim 11, wherein the flip-flop comprises a second NOR gate cross-coupled with the first NOR gate.

16. A system, comprising:
a flip-flop comprising:
a first NOR gate having a first input, a second input, and an output; and
a second NOR gate having a first input, a second input coupled to the output of the first NOR gate, and an output coupled to the second input of the first NOR gate; and
a clock-gating device comprising:
a logic device configured to receive an input signal of the flip-flop and an output signal of the flip-flop, and to output an enable signal based on the input signal and the output signal, wherein the enable signal has a first logic value if the input signal and the output signal have different logic values, the enable signal has the first logic value if both the input signal and the output signal have a logic value of zero, and the enable signal has a second logic value if both the input signal and the output signal have a logic value of one; and
a gate device configured to receive the enable signal, to pass a clock signal to the first input of the first NOR gate if the enable signal has the first logic value, and to gate the clock signal if the enable signal has the second logic value.

17. The system of claim 16, wherein the first logic value is a logic one and the second logic value is a logic zero.

18. The system of claim 16, wherein the gate device outputs a logic zero to the first input of the first NOR gate when the clock signal is gated independent of a logic state of the clock signal.

19. The system of claim 16, wherein the flip-flop further comprises an AND gate having a first input configured to receive the input signal, a second input configured to receive the clock signal, and an output coupled to the first input of the second NOR gate.

20. The system of claim 19, wherein flip-flop further comprises an inverter configured to invert an input clock signal to produce the clock signal, and the gate device is not on a clock path between the inverter and the second input of the AND gate.

21. The system of claim 16, wherein the logic device comprises a NAND gate having a first input configured to receive the input signal of the flip-flop, a second input configured to receive the output signal of the flip-flop, and an output that outputs the enable signal.

22. The system of claim 21, wherein the gate device comprises an AND gate having a first input coupled to the output of the NAND gate, a second input configured to receive the clock signal, and an output coupled to the first input of the first NOR gate.

* * * * *